United States Patent
Majoni

(10) Patent No.: US 11,405,010 B2
(45) Date of Patent: Aug. 2, 2022

(54) METHOD FOR MANUFACTURING A MICROMECHANICAL LAYER STRUCTURE

(71) Applicant: Robert Bosch GmbH, Stuttgart (DE)

(72) Inventor: Stefan Majoni, Weil Im Schoenbuch (DE)

(73) Assignee: Robert Bosch GmbH, Stuttgart (DE)

( * ) Notice: Subject to any disclaimer, the term of this patent is extended or adjusted under 35 U.S.C. 154(b) by 224 days.

(21) Appl. No.: 16/770,452

(22) PCT Filed: Dec. 6, 2018

(86) PCT No.: PCT/EP2018/083829
§ 371 (c)(1),
(2) Date: Jun. 5, 2020

(87) PCT Pub. No.: WO2019/137705
PCT Pub. Date: Jul. 18, 2019

(65) Prior Publication Data
US 2021/0167745 A1 Jun. 3, 2021

(30) Foreign Application Priority Data
Jan. 11, 2018 (DE) .......................... 102018200377.7

(51) Int. Cl.
*H03B 5/30* (2006.01)
*H03H 3/007* (2006.01)
(Continued)

(52) U.S. Cl.
CPC ....... *H03H 3/0072* (2013.01); *B81C 1/00476* (2013.01); *H01L 41/047* (2013.01); *H01L 41/081* (2013.01); *B81B 2201/0271* (2013.01)

(58) Field of Classification Search
CPC .. H03H 3/0072; H03H 2003/021; H03H 3/02; B81C 1/00476; B81C 2203/0145;
(Continued)

(56) References Cited

U.S. PATENT DOCUMENTS

| 2004/0050161 A1 | 3/2004 | Lutz |
| 2004/0125970 A1 | 7/2004 | Kawakubo |

(Continued)

FOREIGN PATENT DOCUMENTS

| JP | 2009077159 | * | 4/2009 |
| JP | 2009077159 A | | 4/2009 |

OTHER PUBLICATIONS

International Search Report for PCT/EP2018/083829, dated Feb. 14, 2019.

*Primary Examiner* — Richard Tan
(74) *Attorney, Agent, or Firm* — Norton Rose Fulbright US LLP; Gerard Messina

(57) ABSTRACT

A method for manufacturing a micromechanical layer structure, including: providing a first protective layer patterned to have at least one opening which is filled with sacrificial layer material; depositing a functional-layer layer structure; producing a first opening in the functional-layer layer structure to at least one opening of the first protective layer, so that in at least one of the layers of the functional-layer layer structure; depositing a second protective layer so that the first opening is filled with material of the second protective layer; patterning the second protective layer and the filled first opening to have a second opening to the first protective layer, the second opening having the same or a lesser width than the first opening; removing sacrificial layer material at least in the opening of the first protective layer; and removing protective layer material at least in the second opening.

16 Claims, 16 Drawing Sheets

(51) Int. Cl.
*B81C 1/00* (2006.01)
*H01L 41/047* (2006.01)
*H01L 41/08* (2006.01)

(58) Field of Classification Search
CPC ... H01L 41/047; H01L 41/081; H01L 41/331; B81B 2201/0271; B81B 2203/0109; C23C 28/345; C23C 28/34; C23C 28/32; C23F 1/12
USPC .......................................................... 331/154
See application file for complete search history.

(56) References Cited

U.S. PATENT DOCUMENTS

| | | |
|---|---|---|
| 2005/0274191 A1 | 12/2005 | Hasegawa et al. |
| 2009/0206422 A1 | 8/2009 | Illing et al. |
| 2010/0125988 A1 | 5/2010 | Nakamura et al. |
| 2017/0244381 A1* | 8/2017 | Lee ....................... H01L 41/047 |

\* cited by examiner

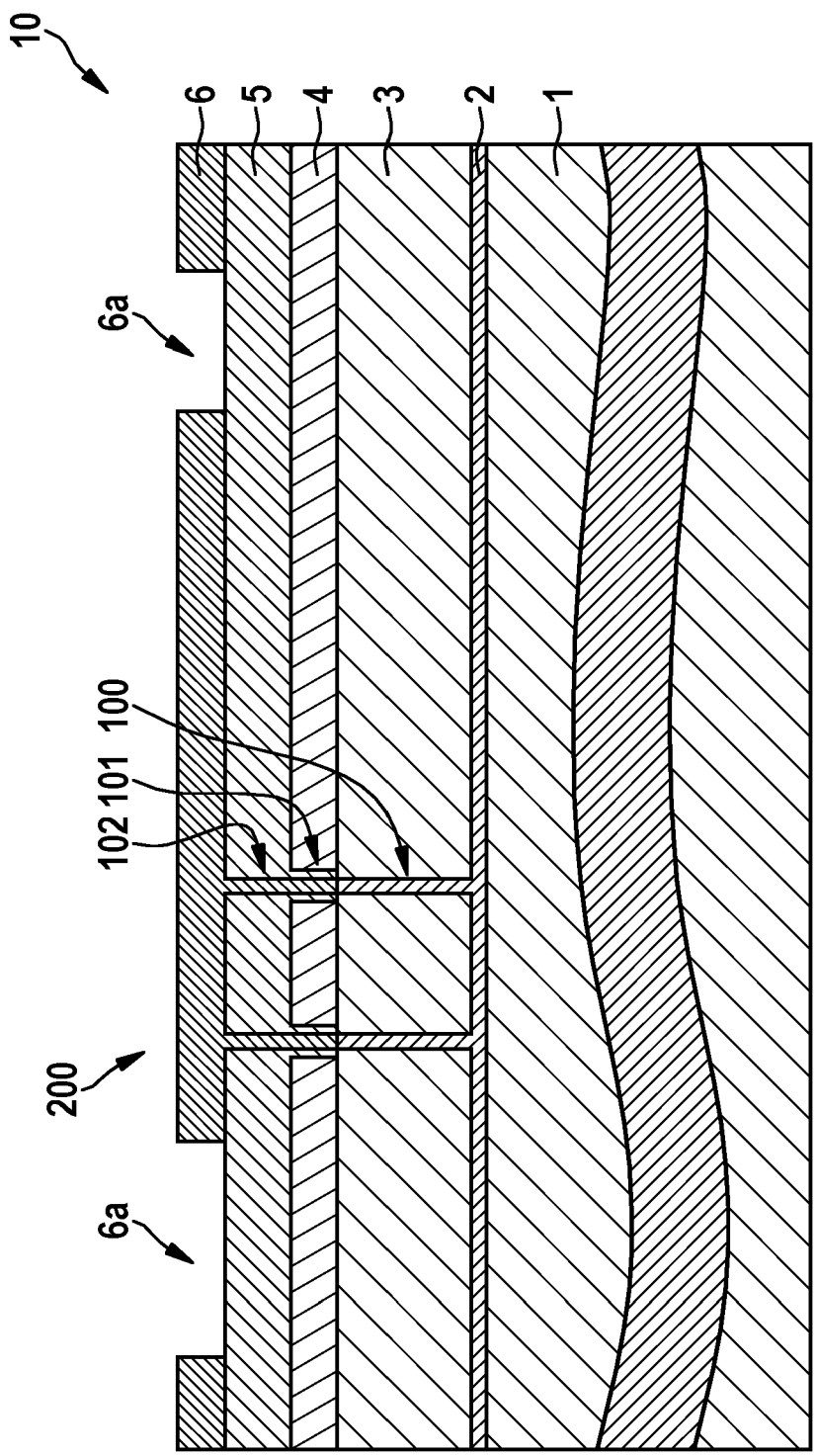

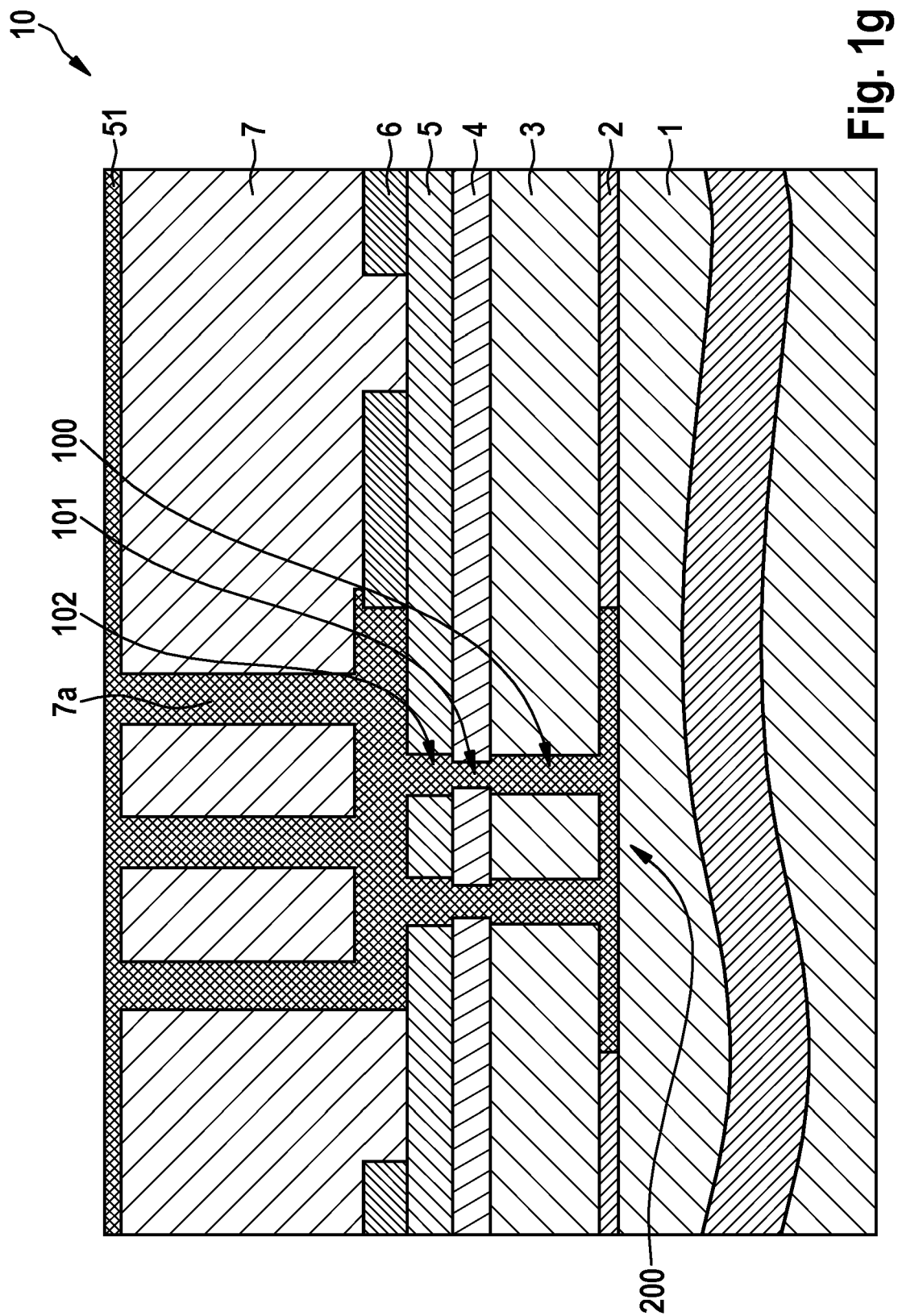

METHOD FOR MANUFACTURING A MICROMECHANICAL LAYER STRUCTURE

FIELD

The present invention relates to a method for manufacturing a micromechanical layer structure.

The present invention further relates to a micromechanical layer structure.

Although the present invention is generally applicable to any micromechanical layer structures, the present invention is described with regard to micromechanical layer structures in the form of resonators having piezoresistive functional layers.

BACKGROUND INFORMATION

Micromechanical resonators are used, for example, as timing generators in clocks, or also in high-speed electronic communications devices, such as for Wi-Fi, Bluetooth, NFC or the like. In order to manufacture such resonators, micromechanical layer structures are produced, these are specially patterned, and sacrificial layers are deposited, which are removed again later. Gas-phase etching methods are often used for removing the sacrificial layers.

A quality of a micromechanical resonator is determined from the electrical resistance of the corresponding RC-element. In this connection, the quality influences the precision and the power consumption of the micromechanical resonator. The lower the power consumption, the higher the quality of the resonator. In this case, the electrical resistance of the RC-element is from electrodes and leads; for example, tungsten being used for the electrodes, in order to attain a lower electrical resistance, which renders possible a low power consumption and a high quality of the resonator.

SUMMARY

In one specific example embodiment, the present invention provides a method for manufacturing a micromechanical layer structure, including the steps
  providing a first protective layer, the first protective layer being patterned to have at least one opening, which is filled with sacrificial layer material;
  depositing a functional-layer layer structure on the first protective layer, the functional-layer layer structure including at least one functional layer;
  producing a first opening in the functional-layer layer structure to at least one opening of the first protective layer, so that in at least one of the layers of the functional-layer layer structure, a width of the first opening in the functional-layer layer structure is greater than or equal to the width of the at least one opening of the first protective layer;
  depositing a second protective layer on the functional-layer layer structure in such a manner, that the first opening is filled with material of the second protective layer;
  patterning the second protective layer and the filled, first opening to have a second opening to the first protective layer, the second opening having the same or a lesser width than the first opening, so that in the case of a lesser width of the second opening, the walls of the second opening are formed by material of the second protective layer;
  removing sacrificial-layer material at least in the opening of the first protective layer; and
  removing protective-layer material at least in the second opening.

In a further specific example embodiment, the present invention provides a micromechanical layer structure manufactured by the example method, the micromechanical layer structure having a first protective layer including, in particular, silicon; a functional-layer layer structure, which is situated on the first protective layer and includes at least one functional layer, in particular, a piezoelectric layer; a second protective layer, which is situated on the functional-layer layer structure and includes, in particular, silicon; at least one opening being positioned, which extends in a vertical direction through the functional-layer layer structure and the protective layers, in order to release a part of the micromechanical layer structure.

Herein, the term "protective layer" is to be understood as a layer, whose material is inert with respect to at least one etching method, in particular, a gas-phase etching method. In this context, a protective layer may be made of silicon and used as an electrode layer for contacting a functional layer. In other words, the term "protective layer" may also be understood to be an electrode, a circuit trace or the like.

Herein, the term "opening" is to be understood as patterning in the form of a hole, a trench, a vertical channel, a slot, an orifice, a break or the like, in the respective layer, which allows a fluid connection to one or more underlying layers and/or openings.

In accordance with the present invention, one of the advantages consequently attained is that, owing to the protective layers, the functional layer is protected from negative effects due to aggressive, further method steps, in particular, gas-phase etching that utilizes hydrogen fluoride. A further advantage is that process equipment for carrying out later production steps is protected from contamination by material of the functional layer. For example, epitaxial silicon is deposited at approximately 1000° C., or polycrystalline silicon and silicon oxide are deposited at approximately 600-800°, which means that in this case, outgassing of material of the functional layer, which contaminates the process equipment, takes place due to the high temperatures. Depositing the protective layers renders exclusive process equipment for this contaminating operation no longer necessary, which means that considerable, additional costs are avoided. In the same way, the need for complex, cost-intensive cleaning and recalibration of the process equipment is eliminated. A further advantage is that, if the specific protective layer is made of silicon, this layer may be used simultaneously as an electrode or as an electrical lead for electrical contacting of the functional layer. A further advantage is that more effective resonators, that is, resonators having a higher quality, may be produced if, in particular, metal-containing piezoelectric materials may be used.

For example,
  aluminum nitride,
  lead zirconate titanate, and/or
  scandium-doped aluminum nitride may be used as materials for the functional layers.

The following, which contain, or are at least partially made of metal or a metallic compound, may be used, for example, as materials for the electrode layers/circuit traces:
  tungsten,
  tungsten silicide,
  titanium,
  titanium nitride,
  titanium silicide,
  platinum,
  palladium, copper,
tantalum,
molybdenum,
tantalum silicide, or the like.

Further features, advantages and additional specific embodiments of the present invention are described in the following or become apparent from it.

According to an advantageous further refinement of the present invention, protective layer material is removed in the lateral direction in the openings in at least one of the protective layers. An advantage of this is that a precise release is rendered possible. In addition, the flexibility is increased, since functional layers in the functional-layer layer structure, which also have different widths, may also be released with the aid of the openings, and thus, the protective layer deposited in advance may be removed not only vertically, but also laterally.

According to another advantageous further refinement of the present invention, the sacrificial layer material and/or the protective layer material is removed, using gas-phase etching. An advantage of this is that, in particular, reliable and conventional methods for removing sacrificial layers may be used.

According to another advantageous further refinement of the present invention, the sacrificial layer material is removed on the basis of hydrogen fluoride, and/or the protective layer material is removed on the basis of a halogen fluoride. An advantage of this is that, in each instance, sacrificial layer material and/or protective layer material may be removed deliberately and/or selectively by different etchants, without unwanted removal of the other material.

According to another advantageous further refinement of the present invention, the deposition of the functional-layer layer structure includes the steps:

depositing a functional layer on the first protective layer;
depositing an electrode layer on the deposited functional layer, the electrode layer at least partially containing a metal and/or a metallic compound, in particular, a metallic nitride compound and/or a metallic silicide compound.

In particular, a highly conductive metal is used for this electrode layer. Consequently, an advantage of this is that firstly, the flexibility is generally increased, since a plurality of layers may be positioned in the functional-layer layer structure; and secondly, improved, that is, low-resistance, contacting of the functional layer is rendered possible by the electrode layer, which at least partially contains a metal and/or a metallic compound, for example, is made of a metal, metallic nitride or a metallic silicide compound. In this context, the contacting of the functional layer may take place via both an electrode layer, which at least partially contains a metal and/or a metallic compound, and a protective layer of silicon. On the whole, the resistance for the contacting of the functional layer decreases in both the electrodes and the leads.

According to another advantageous further refinement of the present invention, the first opening in the electrode layer is produced to have a width, which is greater than or equal to the width of the first opening of the underlying functional layer. Consequently, in the further course of the manufacturing method, a protective layer, which then protects the electrode layer in the lateral direction, may be deposited in a lateral direction in the region of the electrode layer, in a simple manner.

According to another advantageous further refinement of the present invention, an intermediate protective layer is deposited on the functional layer prior to the deposition of the electrode layer. In this manner, for example, the materials of the two layers, on one side, the functional layer, and on the other side, the electrode layer, which at least partially contains a metal and/or a metallic compound, may be prevented from reacting with each other in the vertical direction. An example of this is a functional layer made of aluminum nitride and an electrode layer made of tungsten.

According to another advantageous further refinement of the present invention, the protective layer material in the first opening in the electrode layer is removed completely in the lateral direction in the upper region of the opening, and only partially in the lateral direction in the lower region. One of the advantages attained by this is that, consequently, a reaction of materials of the layers, on one side, the functional layer, and on the other side, the electrode layer, may be prevented in an even more effective manner.

According to another advantageous further refinement of the present invention, the openings in different layers above the first protective layer may be produced to have different widths; in particular, the width of the first opening decreasing layer-by-layer from top to bottom. In this manner, for example, lateral protective layers may remain in their respective layers from top to bottom, so that these are protected in corresponding, subsequent processes, such as the removal of a sacrificial layer.

According to another advantageous further refinement of the present invention, sacrificial layer material is deposited in order to close the first opening prior to the deposition of the second protective layer, and/or in order to close the second opening after the patterning of the second protective layer. In particular, after the sacrificial material is deposited, this may still be patterned. An advantage of this is that simple manufacture of the micromechanical layer structure is enabled. Under the first protective layer, sacrificial layer material may also be deposited in advance on a substrate or the like.

According to an advantageous further refinement of the micromechanical layer structure according to the present invention, the opening in a protective layer has a greater width below and/or above the functional layer than in the functional layer. In this manner, as large a release as possible is enabled, for example, by a resonator formed by the release of the functional layer.

According to another advantageous further refinement of the present invention, an electrode layer, which at least partially contains a metal and/or a metallic compound, is situated above the functional layer. This enables simple and reliable contacting at a low electrical resistance.

According to another advantageous further refinement of the present invention, the width of the opening in the electrode layer is greater than or equal to the width of the opening in the functional layer. In this manner, for example, the electrode layer may be provided with protective layer material in the lateral direction within the electrode layer in an even simpler manner, without consequently reducing, on the whole, the minimum width of all openings in the layers above the first protective layer.

According to another advantageous further refinement of the present invention, an intermediate protective layer is situated between the functional layer and the electrode layer, and the opening has a greater width in the region of the intermediate protective layer than at least one of the two adjacent layers. An intermediate protective layer allows the two layers to be structurally separated and prevents the materials of the two adjacent layers from reacting with each other during the manufacturing process of the micromechanical layer structure.

According to another advantageous further refinement of the present invention, at least one of the protective layers is situated partially in an opening in at least one of the functional layers; in particular, this being situated only in the lower region of the opening in the respective functional layer. An advantage of this is that, in addition to its vertical separation from the functional layer, the electrode layer is even provided partially with a protective layer in the lateral direction, which renders possible a particularly robust construction of the released region of the functional-layer layer structure.

Additional, features and advantages of the present invention are shown in the figures and are described herein.

It is understood that the features mentioned above and explained below may be used not only in the respectively indicated combination, but also in other combinations, or by themselves, without departing from the scope of the present invention.

Preferred variants and specific embodiments of the present invention are shown in the figures and are explained in more detail in the description below, in which case identical reference numerals denote the same or similar or functionally identical components or elements.

BRIEF DESCRIPTION OF THE DRAWINGS

FIGS. 1a-g show steps of a method according to one specific embodiment of the present invention.

DETAILED DESCRIPTION OF EXAMPLE EMBODIMENTS

FIGS. 1a-1g show, in cross-section, steps of a method according to a specific embodiment of the present invention.

Figure 1A:
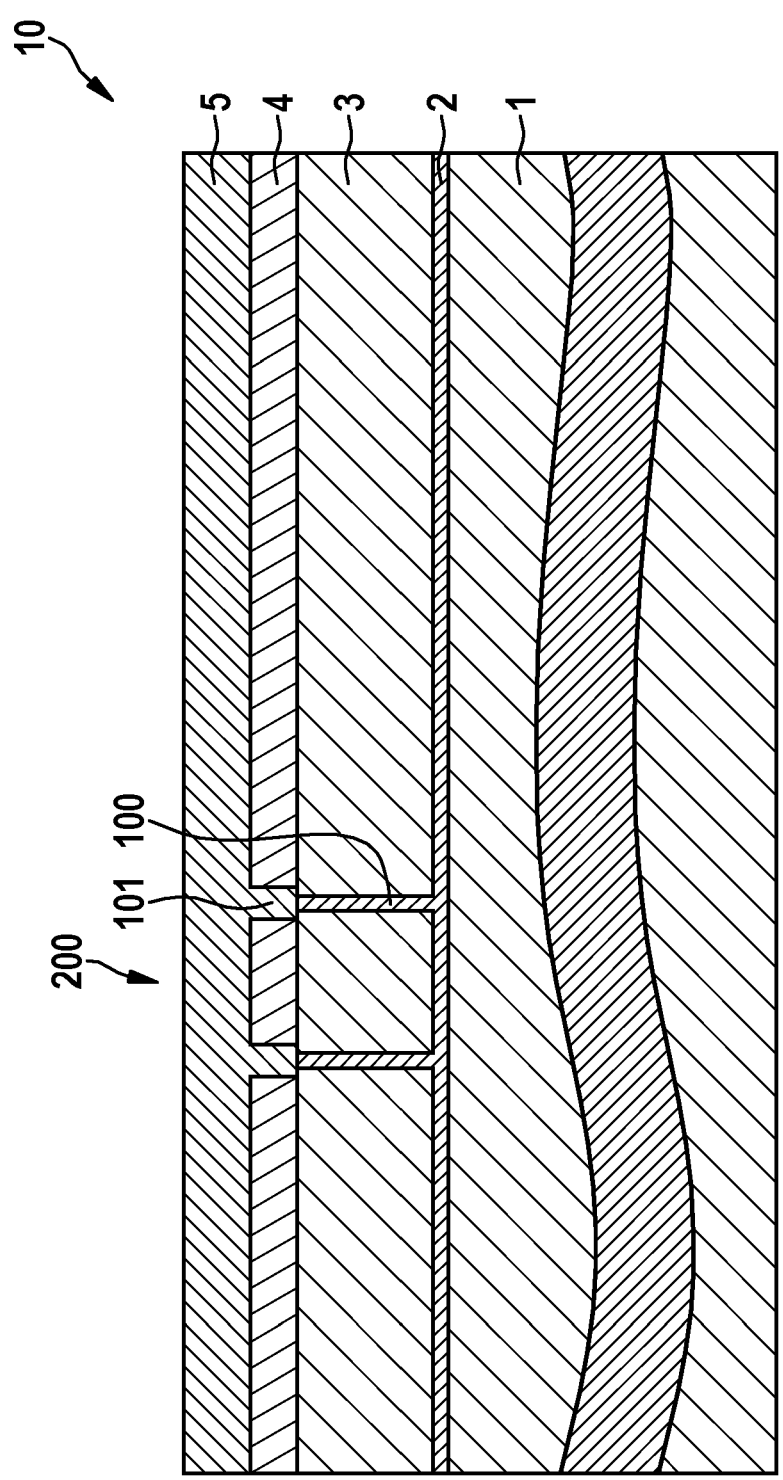

A cross-section of a micromechanical layer structure 10, which, from the bottom upwards, initially includes a substrate 1, is shown in FIG. 1a. A sacrificial layer 2 of, for example, silicon oxide, is deposited on substrate 1. A lower electrode layer 3 of, for example, silicon, which is patterned to have two openings 100 to sacrificial layer 2 that are filled with sacrificial layer material, is deposited on sacrificial layer 2. A piezoelectric layer 4 of, for example, aluminum nitride, which is patterned to have two openings 101 whose width is greater than the width of openings 100 of lower electrode layer 3, is deposited on the upper side of lower electrode layer 3. However, the widths may also be equal. An upper electrode layer 5 of, for example, silicon, whose material is likewise situated in openings 101 of piezoelectric layer 4, is situated on piezoelectric layer 4. Openings 101 are situated above the respective openings 100 of lower electrode layer 3. In this context, openings 100, 101 are positioned in such a manner, that a part of the micromechanical layer structure is released to form a micromechanical element, in this case, a resonator 200.

Figure 1B:
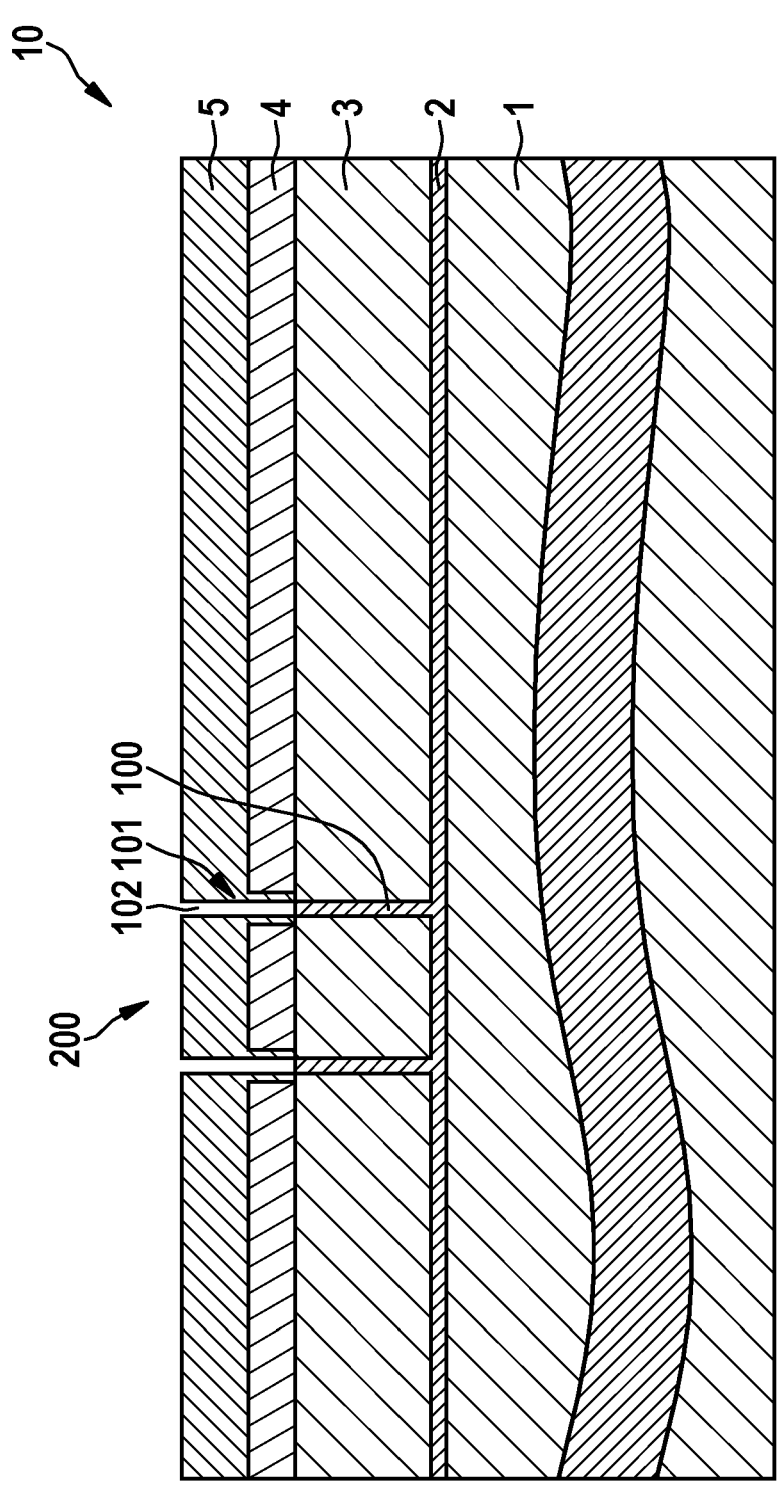

FIG. 1b essentially shows a micromechanical layer structure 10 according to FIG. 1a. In contrast to micromechanical layer structure 10 shown in FIG. 1a, in the micromechanical layer structure 10 shown in FIG. 1b, two second openings 102 through piezoelectric layer 4 and upper electrode layer 5 have now been produced for access to openings 100, 101; openings 100 being filled with sacrificial layer material. However, the diameter of second openings 102 has a width, which is less than the width of the underlying openings 101 of piezoelectric layer 4, which means that in the region of opening 101, piezoelectric layer 4 is completely surrounded from above, and laterally, by the material of upper electrode layer 5.

FIG. 1c essentially shows a micromechanical layer structure 10 according to FIG. 1b. In contrast to micromechanical layer structure 10 shown in FIG. 1b, in the micromechanical layer structure 10 shown in FIG. 1c, a sacrificial layer 6 is now deposited on upper electrode layer 5; on one hand, the sacrificial layer being patterned (reference numeral 6a); on the other hand, due to the deposition of sacrificial layer 6, material of sacrificial layer 6 being situated in second openings 102 in the region of upper electrode layer 5 and piezoelectric layer 4.

Figure 1D:
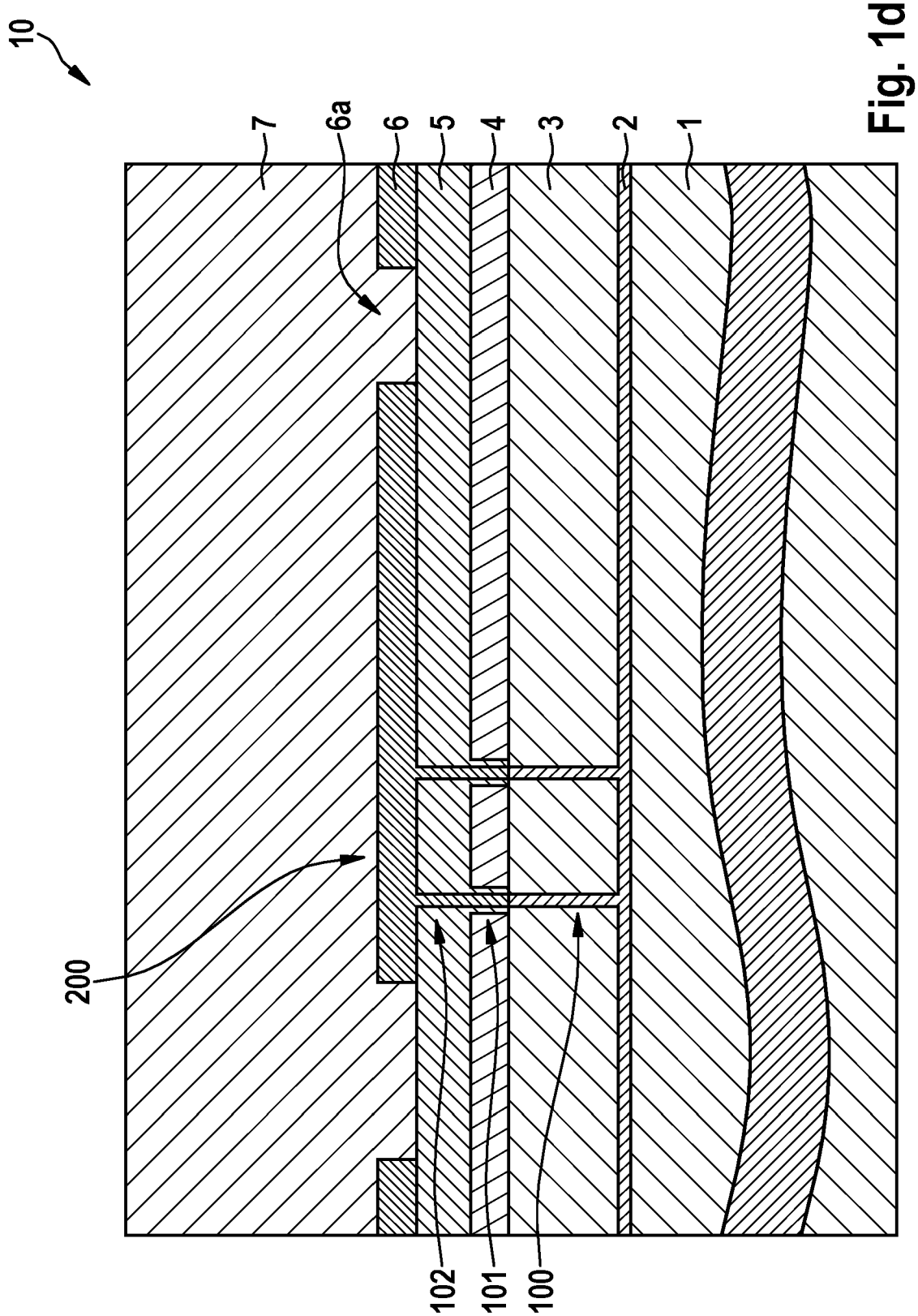

FIG. 1d essentially shows a micromechanical layer structure 10 according to FIG. 1c. In contrast to the micromechanical layer structure 10 shown in FIG. 1c, in the micromechanical layer structure 10 shown in FIG. 1d, an end cap layer 7, which is made of, for example, silicon, is now situated on sacrificial layer 6. The material of end cap layer 7 is situated in the patterns 6a of patterned sacrificial layer 6, as well.

Figure 1E:
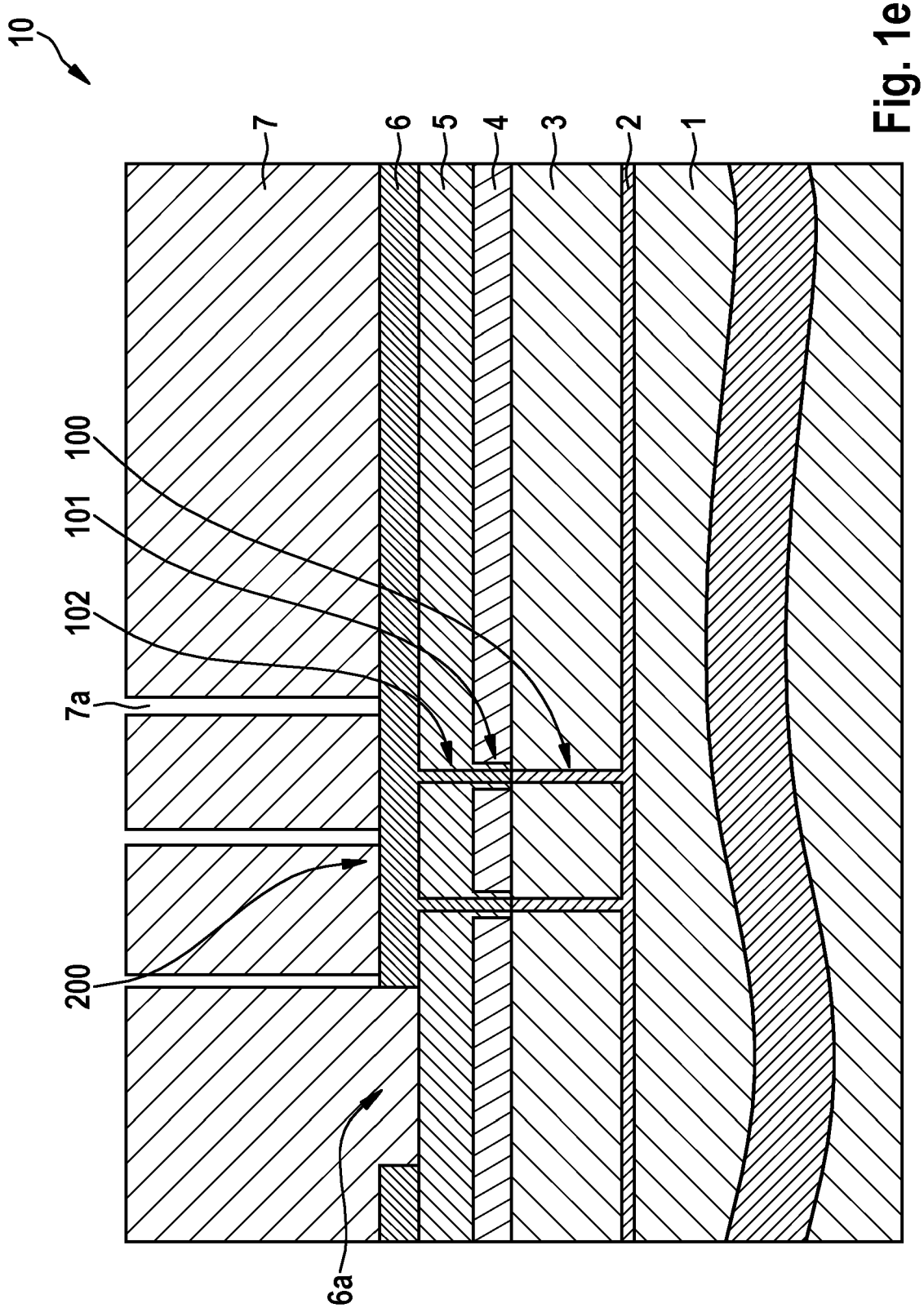

FIG. 1e essentially shows a micromechanical layer structure 10 according to FIG. 1d. In contrast to the micromechanical layer structure 10 shown in FIG. 1d, in the micromechanical layer structure 10 shown in FIG. 1e, openings 7a are now situated in end cap layer 7 for access to sacrificial layer 6.

Figure if essentially shows a micromechanical layer structure 10 according to FIG. 1e. In contrast to the micromechanical layer structure 10 shown in FIG. 1e, in the micromechanical layer structure 10 shown in FIG. 1f, the sacrificial layer material in openings 100, 101 and 102, and even in parts of sacrificial layers 2, 6, has now been removed with the aid of a gas-phase etching method sensitive to silicon oxide, for example, using hydrogen fluoride 50. With the aid of the deposited material of upper protective layer 5, which is also situated in openings 101 of piezoelectric layer 4, these are protected from a reaction with the etching gas in the lateral direction, thus, in the region of openings 100, 101, 102.

Figure 1F:
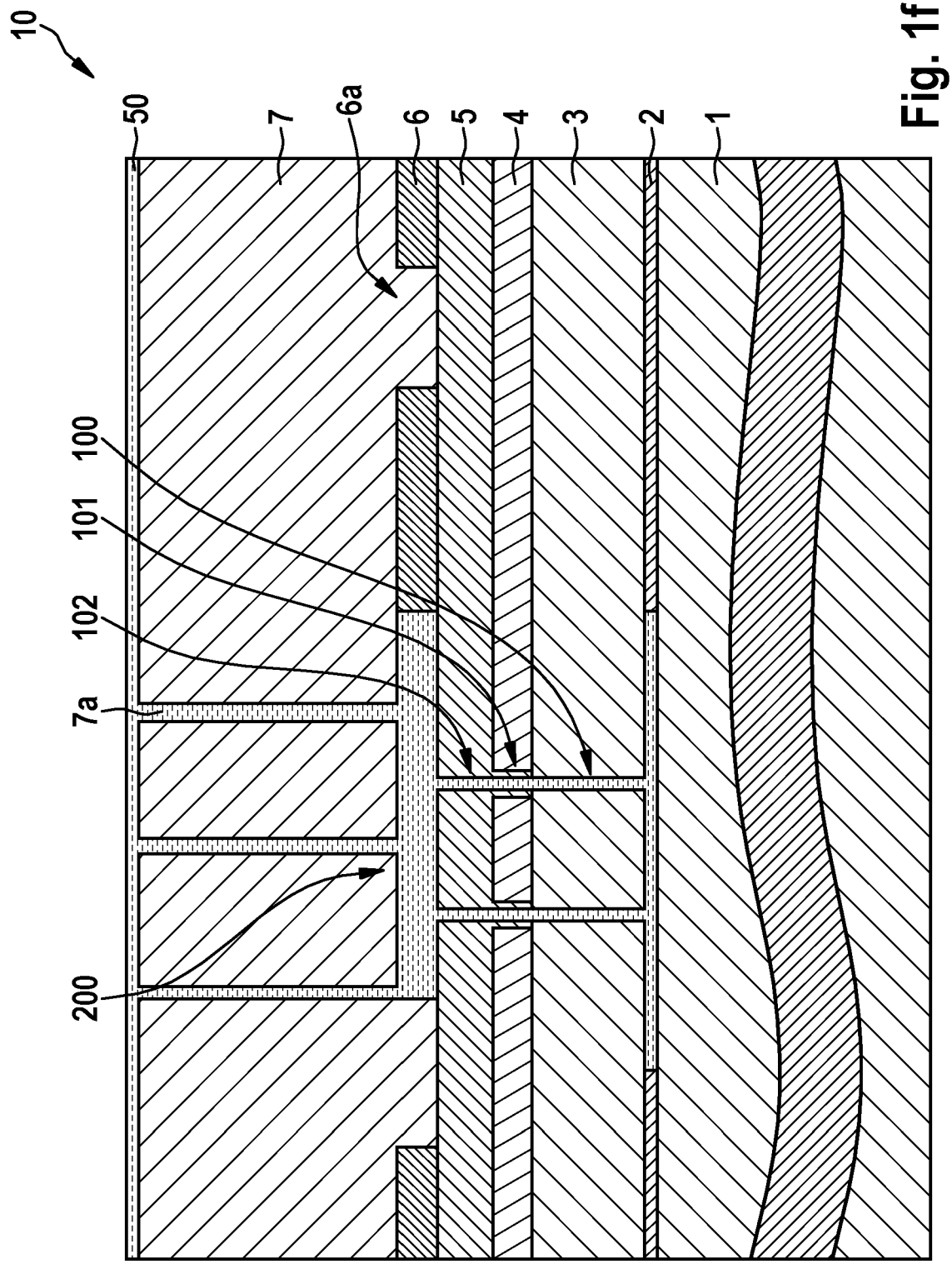

FIG. 1g essentially shows a micromechanical layer structure 10 according to FIG. 1f. In contrast to micromechanical layer structure 10 according to FIG. 1f, in the micromechanical layer structure 10 according to FIG. 1g, with the aid of a gas-phase etching process sensitive to the protective layer material, for example, on the basis of a halogen fluoride 51 for removing silicon, the protective layer material has now been removed partially in openings 100, 101, 102 and in openings 7a, which means that piezoelectric layer 4 is now no longer protected laterally by the protective layer material. With a suitably longer exposure time, a small portion of upper and lower protective layers 3, 5 is also removed in the lateral direction, which means that a part of functional layer 4 of manufactured resonator 200 protrudes from the two protective layers 3, 5 in the lateral direction. In other words, piezoelectric layer 4 of resonator 200 has a greater width than the released, lower and upper protective layers 3, 5 of the same. The two protective layers 3, 5 are used here for contacting functional layer 4 and are electrically conductive.

Figure 2:
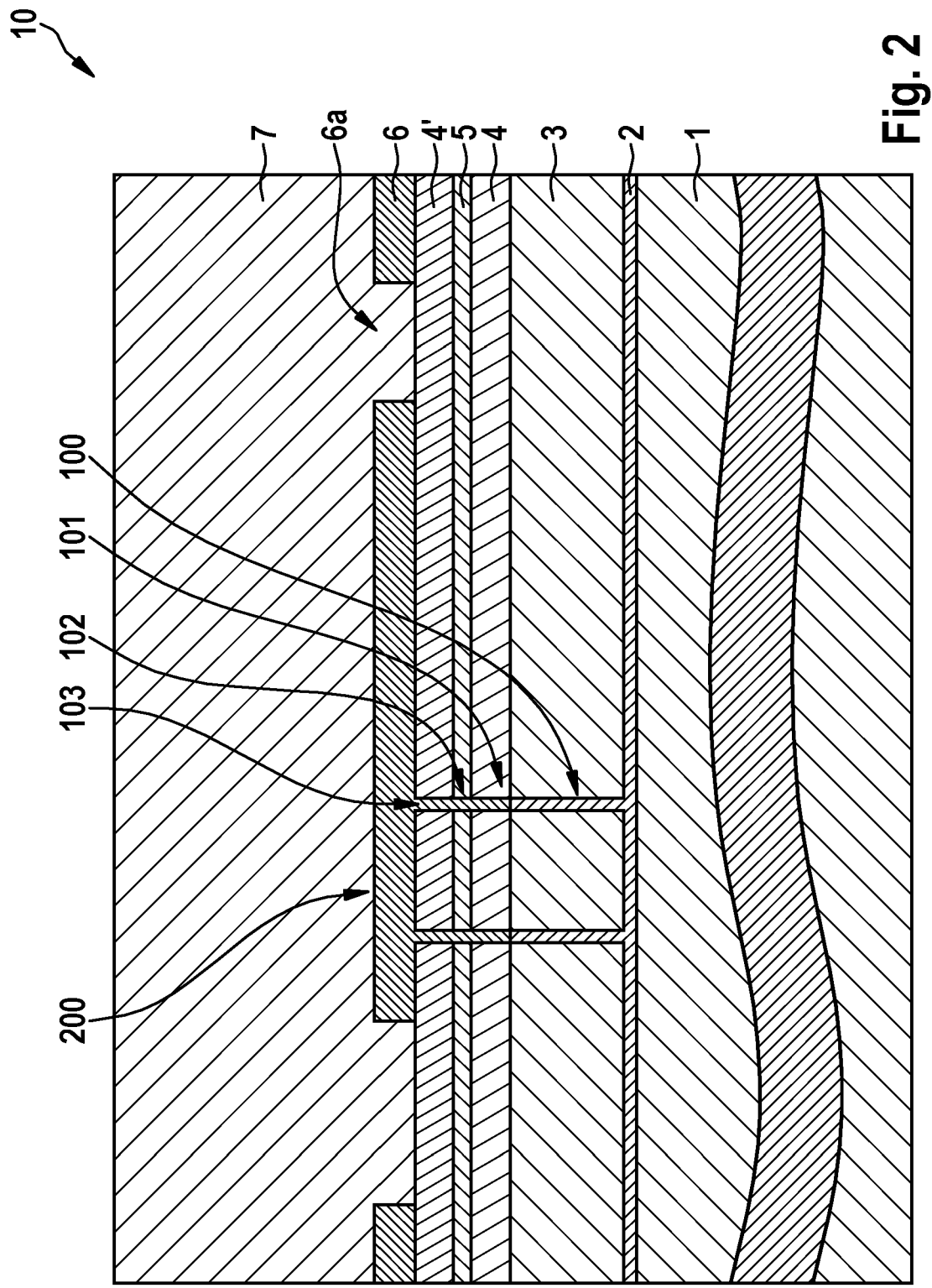
FIG. 2 shows a cross-section of a part of a micromechanical layer structure according to a specific embodiment of the present invention.

FIG. 2 shows a cross-section of a part of a micromechanical layer structure according to a specific embodiment of the present invention.

FIG. 2 essentially shows a micromechanical layer structure 10 according to FIG. 1d. In contrast to micromechanical layer structure 10 shown in FIG. 1d, an electrode layer 4' made of, for example, metal or a metallic silicide, is now situated in the micromechanical layer structure 10 according to FIG. 2. Protective layer 5 is now situated between the two layers 4, 4'. In addition, electrode layer 4' is provided with openings 103 corresponding to the openings 101 of first functional layer 4. The same applies accordingly to upper protective layer 5. This has openings 102 corresponding to the two layers 4, 4'. Here, all of the openings 100, 101, 102 and 103 have the same width and are filled with sacrificial layer material of sacrificial layer 2 and/or of sacrificial layer 6. In this manner, a reaction between electrode and functional layers 4, 4' may be prevented by protective layer 5. In addition, outgassing from corresponding processes at high temperatures may be suitably prevented by protective layer 5 to a large extent.

Figure 3A:
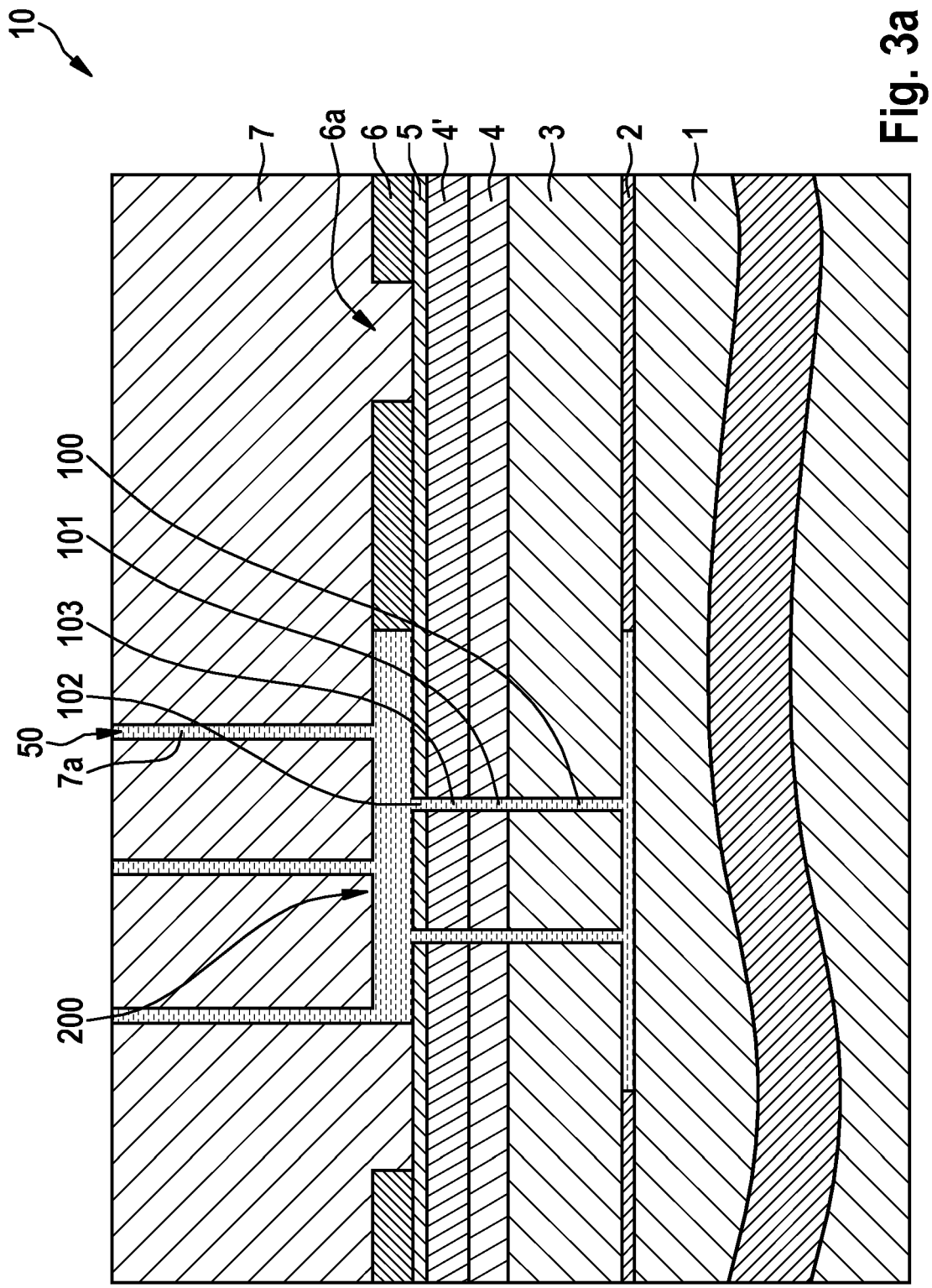
FIGS. 3a-c each show a cross-section of a micromechanical layer structure according to a further specific embodiment of the present invention.
Figure 3B:
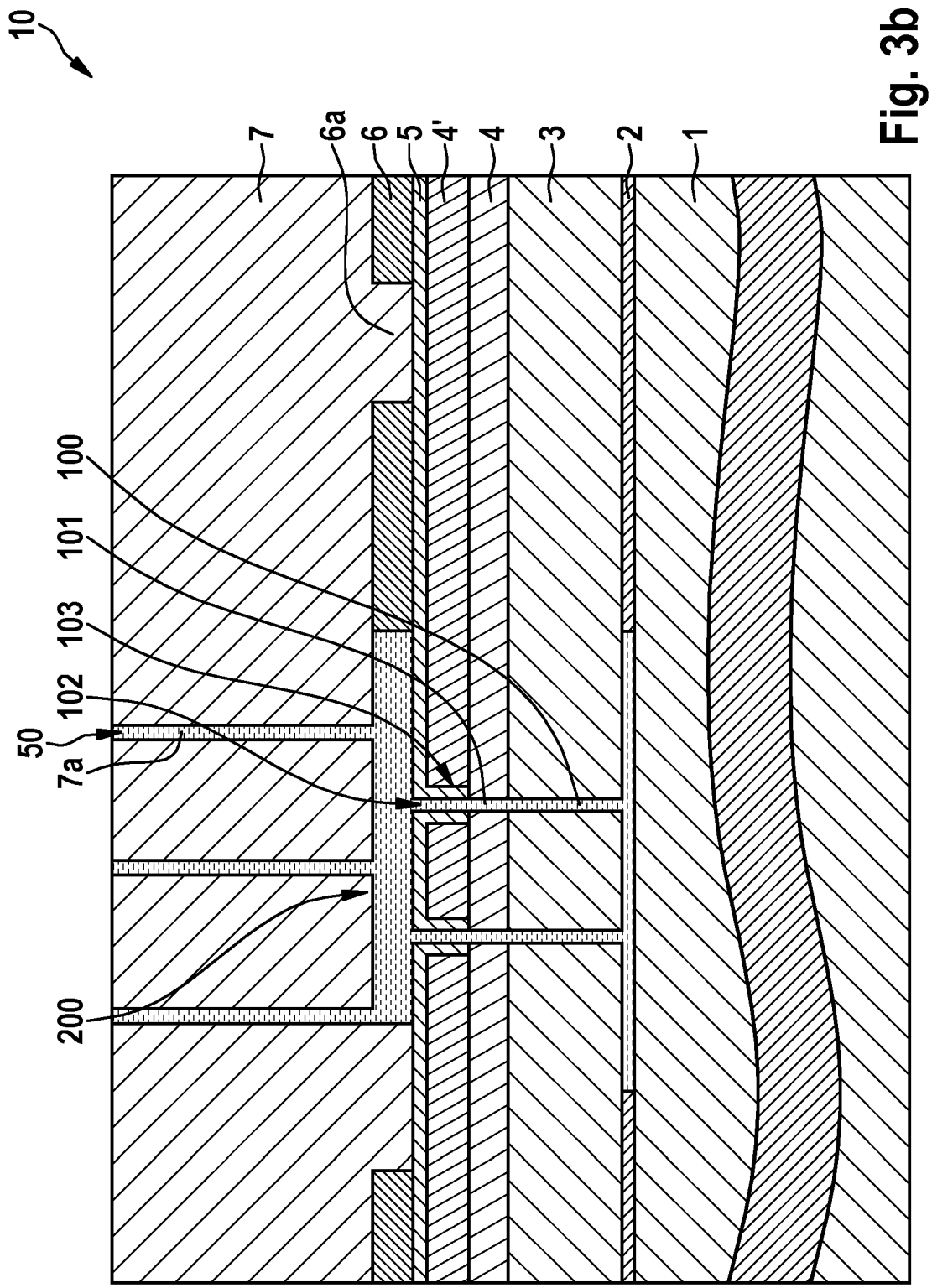
Figure 3C:
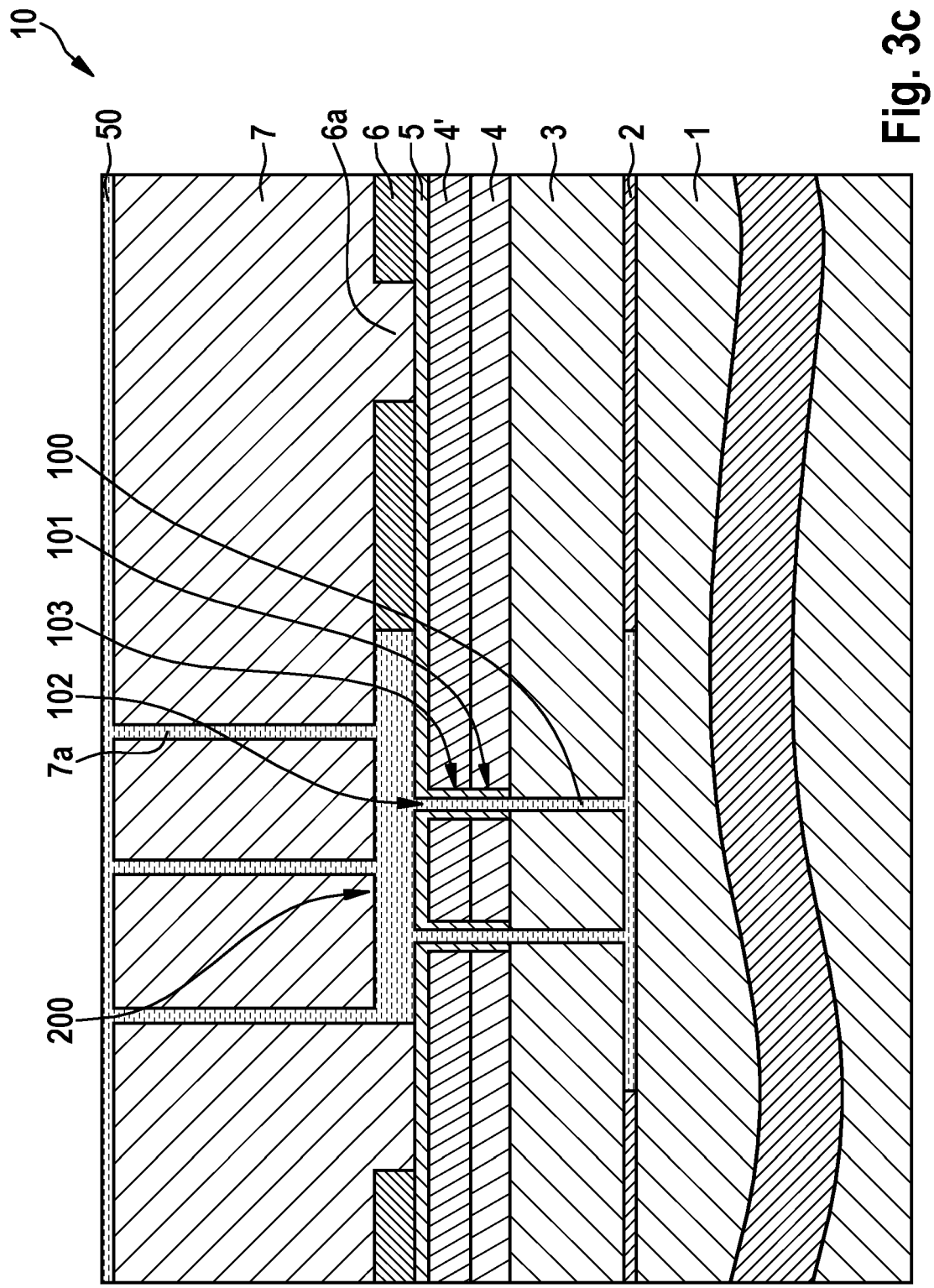

FIGS. 3a-c each show a cross-section of a micromechanical layer structure according to further specific embodiments of the present invention.

FIG. 3a essentially shows a micromechanical layer structure 10 according to FIG. 1f. In contrast to the micromechanical layer structure 10 according to FIG. 1f, in micromechanical layer structure 10 according to FIG. 3a, in place of only one functional layer 4, functional layer 4 and an electrode layer 4' are now situated one above the other; second protective layer 5 being deposited on electrode layer 4'. Electrode layer 4' is made of metal. In addition, the lateral protective layer in openings 101, 103 is missing in FIG. 3a. However, protective layer 5 is also used as a vertical protective layer, and during removal of sacrificial layer material by a gas-phase etching method 50 sensitive to sacrificial layer material, the protective layer prevents piezoelectric layer 4 from being attacked in the vertical direction during the gas-phase etching operation.

FIG. 3b essentially shows a micromechanical layer structure 10 according to FIG. 3a. In contrast to the micromechanical layer structure 10 shown in FIG. 3a, in micromechanical layer structure 10 shown in FIG. 3b, the width of openings 102 in electrode layer 4' is greater than that of openings 101 in functional layer 4: Protective layer material is situated in openings 102 of electrode layer 4', as it is on electrode layer 4', as well.

FIG. 3c essentially shows a micromechanical layer structure 10 according to FIG. 3b. In contrast to the micromechanical layer structure 10 shown in FIG. 3b, in micromechanical layer structure 10 shown in FIG. 3c, the width of openings 102 in electrode layer 4' is now the same as that of openings 101 in functional layer 4. Openings 101, 102 in the two layers 4, 4' have a greater width than opening 100 of lower protective layer 3, which means that in the region of the resonator 200 to be manufactured, the two layers 4, 4' are protected over sacrificial layer material in all directions, while it is being removed.

Figure 3D:
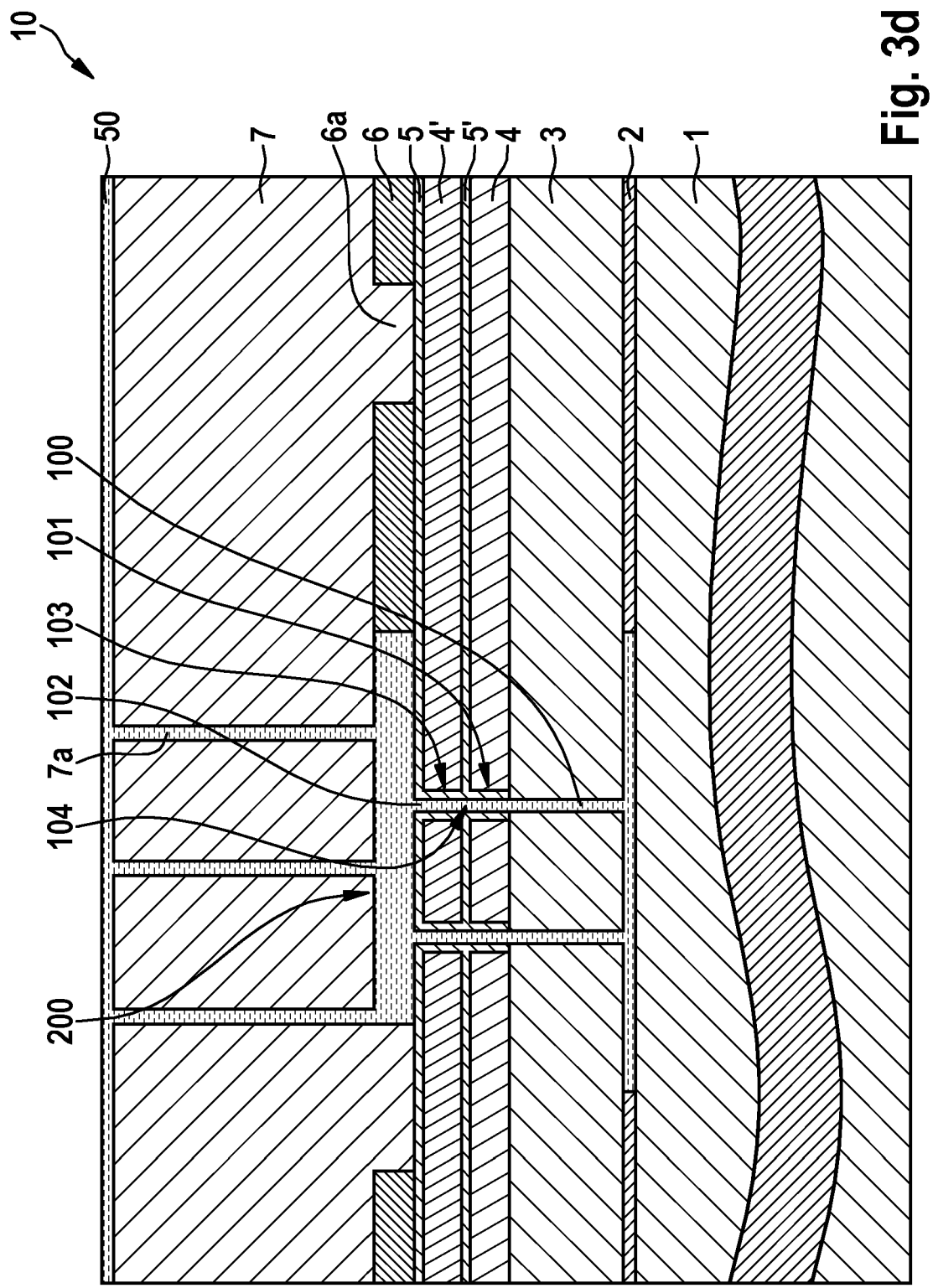
FIGS. 3d-e show cross-sections of micromechanical layer structures after steps of a method according to a specific embodiment of the present invention.
Figure 3E:
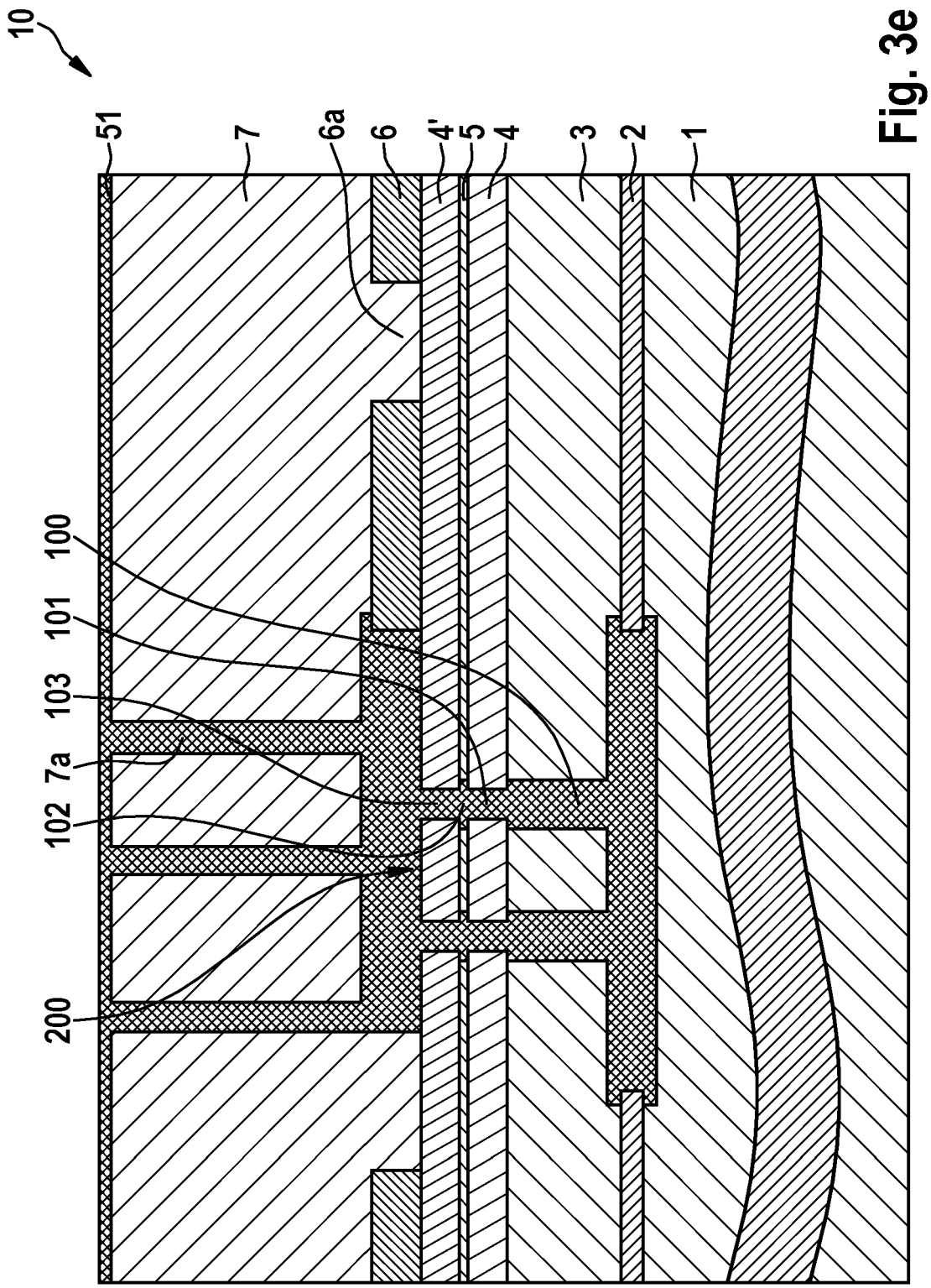

FIGS. 3d and 3e show cross-sections of micromechanical layer structures after steps of a method according to a specific embodiment of the present invention.

FIG. 3d essentially shows a micromechanical layer structure 10 according to FIG. 3c. In contrast to the micromechanical layer structure 10 shown in FIG. 3c, in micromechanical layer structure 10 shown in FIG. 3d, a protective layer 5' is now situated between functional and electrode layers 4, 4'. Therefore, all in all, when sacrificial layer material is removed, the two layers 4, 4' are each surrounded completely by protective layer material in the region of the resonator 200 to be manufactured.

FIG. 3e essentially shows the micromechanical layer structure 10 according to FIG. 3d, after the use of a gas-phase etching method for removal of protective layer material. Now, functional and electrode layers 4, 4' are essentially freed of protective layer material laterally, and electrode layer 4' is also freed of it on its upper side.

Figure 4A:
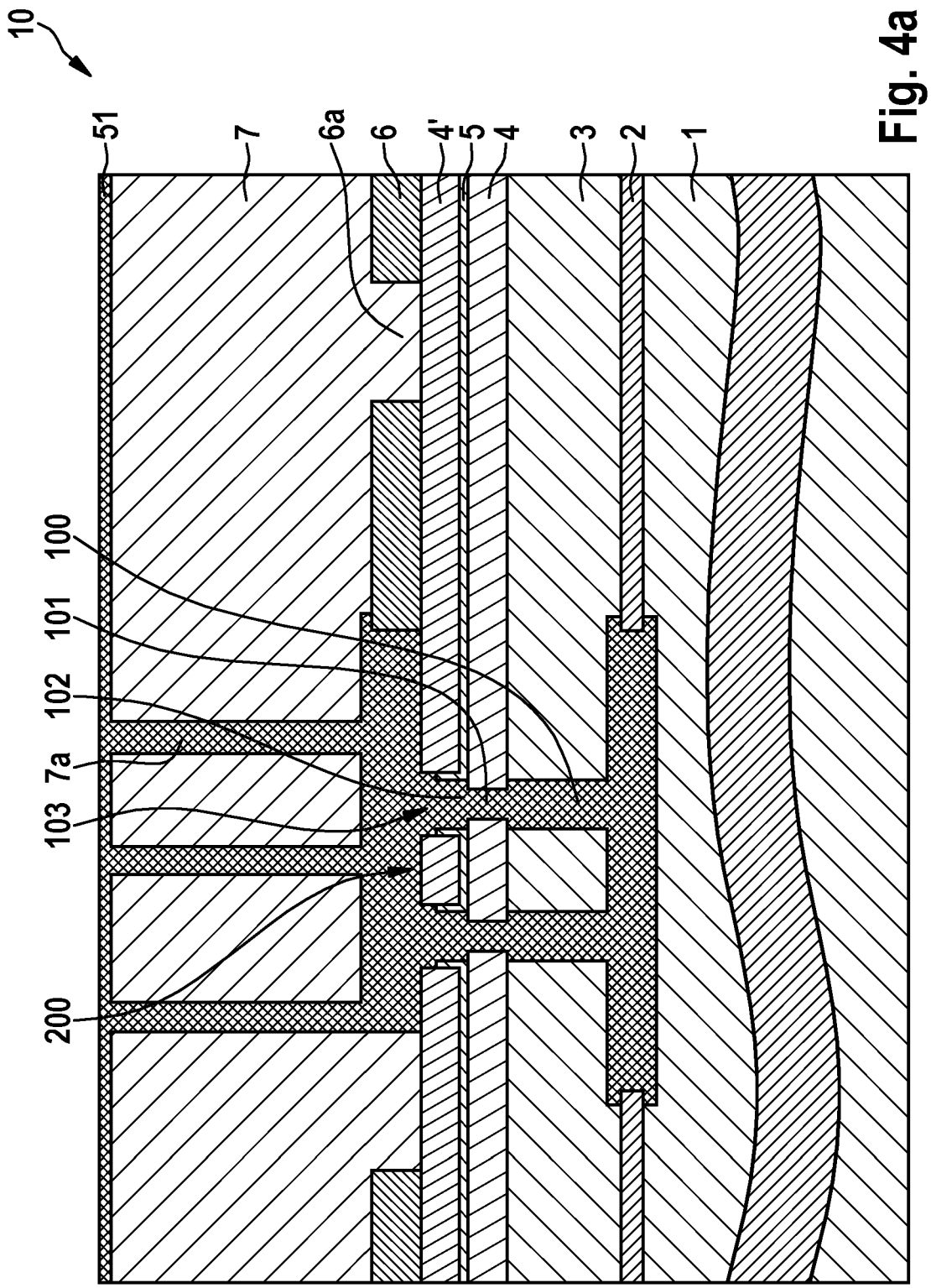
FIGS. 4a-4b show cross-sections of micromechanical layer structures after steps of a method according to a specific embodiment of the present invention.
Figure 4B:
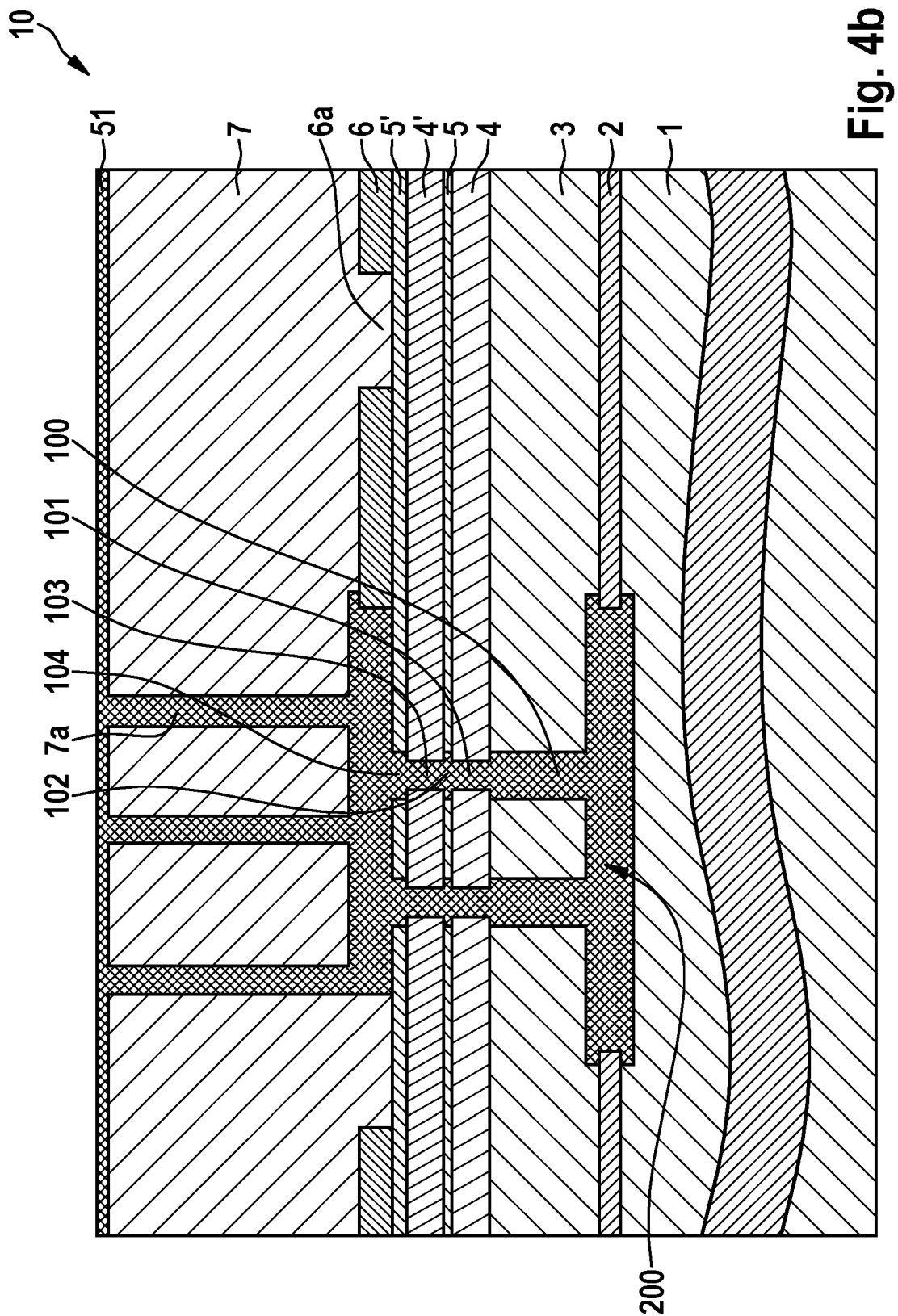

FIGS. 4a through 4b show cross-sections of micromechanical layer structures after steps of a method according to a specific embodiment of the present invention.

FIG. 4a essentially shows a micromechanical layer structure 10 according to FIG. 3b. In contrast to the micromechanical layer structure 10 shown in FIG. 3b, in micromechanical layer structure 10 shown in FIG. 4a, firstly, protective layer 5 is now situated between functional and electrode layers 4, 4', which means that electrode layer 4' does not have an overlying protective layer. Secondly, the width of openings 103 in upper electrode layer 4' is greater than that of corresponding openings 101 in functional layer 4. In addition, during removal of protective layer material in openings 103 of electrode layer 4', it is not removed in the lateral direction in the lower region of openings 103. Thus, in cross-section, the released region of electrode layer 4' in FIG. 4a is surrounded by protective layer material in the shape of a U in the region of resonator 200. On the side facing away from resonator 200, electrode layer 4' is surrounded by protective layer material in an essentially L-shaped manner, in the form of protective layer 5 and a respective vertical extension in openings 103.

FIG. 4b essentially shows a micromechanical layer structure 10 according to FIG. 3e. In contrast to the micromechanical layer structure 10 shown in FIG. 3e, in micromechanical layer structure 10 shown in FIG. 4b, a further protective layer 5' is now situated between electrode layer 4' and sacrificial layer 6. During removal of protective layer material, this is only removed in the lateral direction in the region of openings 102, 104. In other words, in FIG. 4b, the further protective layer 5' is formed and/or positioned so as to correspond to protective layer 5.

Figure 5:
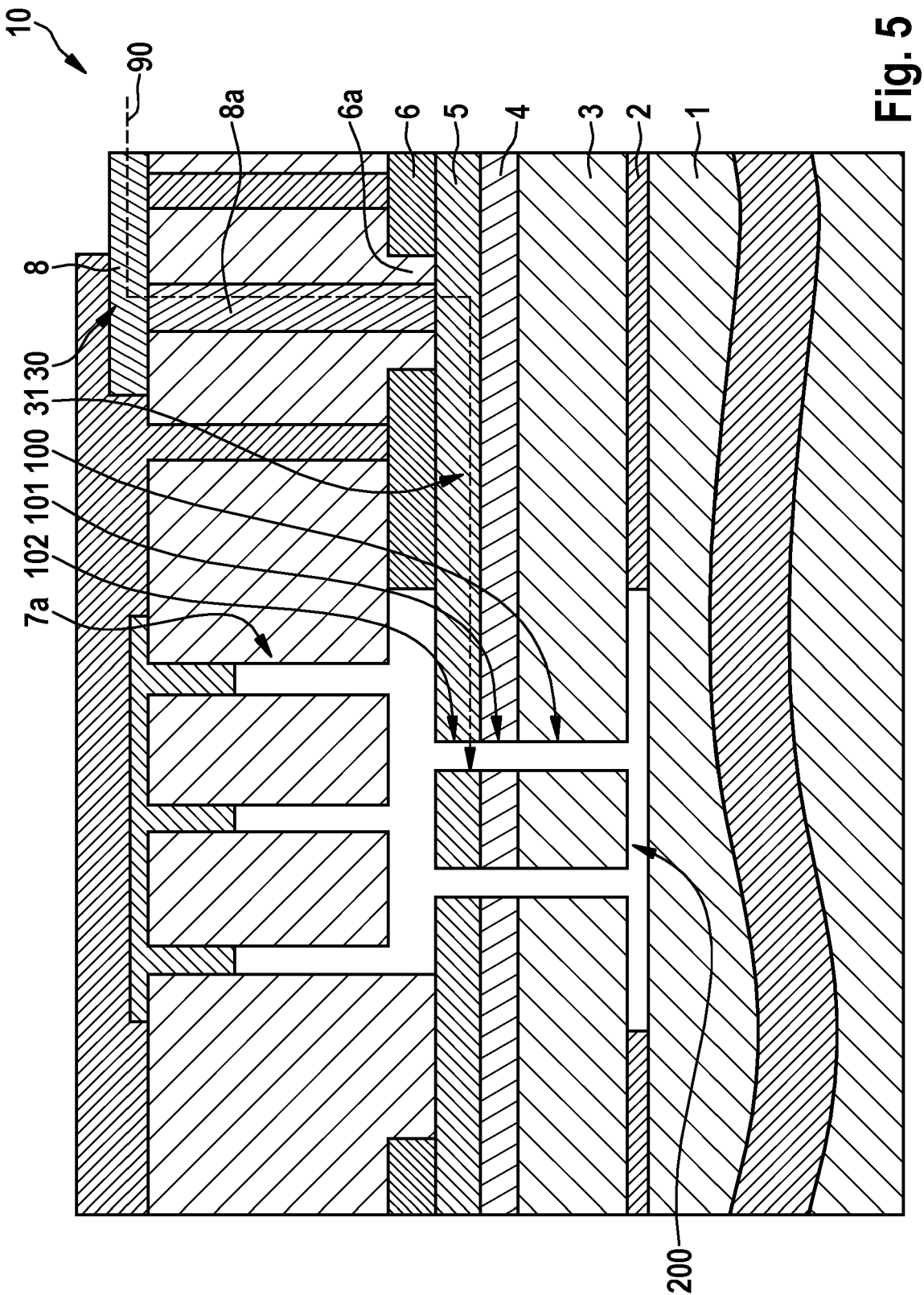
FIG. 5 shows a cross-section of a micromechanical layer structure according to a specific embodiment of the present invention.

FIG. 5 shows a micromechanical layer structure according to a specific embodiment of the present invention.

A fully manufactured, micromechanical layer structure 10 having a resonator 200 is now shown in FIG. 5. In this context, resonator 200 is electrically contacted by a metallic electrode 8, which runs initially horizontally from right to left along electrical path 90, then extends further in a vertical direction (reference numeral 8a), and is connected to upper protective layer 5. The electrical resistance is low in the region of metallic circuit traces 30. Electrical path 90 then runs inside of protective layer 5 to resonator 200 at a high electrical resistance 31. As shown, for example, in FIG. 4a, the contacting of functional layer 4 may be improved by an electrode layer 4' made of metal in the horizontal direction. If protective layer 5 is then formed to be conductive, as well, then in spite of its higher resistance in comparison with the metallic electrode, it still only contributes a little to the overall resistance of the contacting of resonator 200.

In summary, at least one of the specific embodiments has at least one of the following advantages:

Protecting functional layers from the aggressive effects of subsequent treatments, such as gas-phase etching, heating operations, etc.

Preventing a reaction or diffusion between different layers, in particular, between piezoelectric layers and metallic electrode layers or electrode layers made of metallic silicide.

For later method steps, protecting process equipment from contamination by materials of piezoresistive layers, metals or metallic silicides.

Although the present invention was described in light of preferred exemplary embodiments, it is not limited to them, but is modifiable in numerous ways.

What is claimed is:

1. A method for manufacturing a micromechanical layer structure, comprising the following steps:
   providing a first protective layer, the first protective layer being patterned to include at least one opening that is filled with sacrificial layer material;
   depositing a functional-layer layer structure on the first protective layer, the functional-layer layer structure including at least one functional layer;
   producing a first opening in the functional-layer layer structure to the at least one opening of the first protective layer, so that in at least one of the at least one layer of the functional-layer layer structure, a width of the first opening in the functional-layer layer structure is greater than or equal to a width of the at least one opening of the first protective layer;
   depositing a second protective layer on the functional-layer layer structure in such a manner that the first opening is filled with material of the second protective layer;
   patterning the second protective layer and the filled, first opening to have a second opening to the first protective layer, the second opening having the same or a lesser width than the first opening, so that in the case of the lesser width of the second opening, walls of the second opening are formed by material of the second protective layer; and
   removing the sacrificial layer material at least in the opening of the first protective layer; and
   removing protective layer material at least in the second opening.

2. The method as recited in claim 1, wherein in the first opening and/or the second opening, protective layer material is removed in a lateral direction.

3. The method as recited in claim 1, wherein the sacrificial layer material and/or the protective layer material is removed using gas-phase etching.

4. The method as recited in claim 3, wherein the sacrificial layer material is removed using hydrogen fluoride, and/or the protective layer material is removed using a halogen fluoride.

5. The method as recited in claim 1, wherein the depositing of the functional-layer layer structure includes the following steps:
   depositing the at least one functional layer on the first protective layer; and
   depositing an electrode layer on the deposited at least one functional layer, the electrode layer at least partially containing a metal and/or a metallic compound.

6. The method as recited in claim 5, wherein the electrode layer at least partially contains a metallic nitride compound and/or a metallic silicide compound.

7. The method as recited in claim 5, wherein the first opening in the electrode layer is produced to have a width which is greater than or equal to a width of the first opening of the at least one functional layer.

8. The method as recited in claim 7, wherein an intermediate protective layer is deposited on the at least one functional layer prior to the depositing of the electrode layer.

9. The method as recited in claim 8, wherein in the first opening in the electrode layer, the protective layer material is removed laterally completely in an upper region of the first opening, and removed only partially in the lateral direction in a lower region of the first opening.

10. The method as recited in claim 5, wherein openings having different widths are produced in different layers above the first protective layer.

11. The method as recited in claim 5, wherein a width of the first opening decreases layer-by-layer from top to bottom.

12. The method as recited in claim 1, wherein sacrificial layer material is deposited to close the first opening prior to the depositing of the second protective layer, and/or to close the second opening after the patterning of the second protective layer.

13. A micromechanical layer structure, comprising:
   a first protective layer including silicon;
   a functional-layer layer structure situated on the first protective layer, the functional-layer layer structure including at least one functional layer, the at least one functional layer including a piezoelectric layer; and
   a second protective layer situated on the functional-layer layer structure, the second protective layer including silicon, at least one opening being positioned, which extends in a vertical direction through the functional-layer layer structure, the first protective layer, and the second protective layer, to release a part of the micromechanical layer structure,
   wherein the opening in the first and/or second protective layer has a greater width below and/or above the at least one functional layer than a width of the opening in the at least one functional layer.

14. The micromechanical layer structure as recited in claim 13, wherein an electrode layer, which at least partially contains a metal and/or a metallic compound, is situated above the at least one functional layer in the functional-layer layer structure.

15. A micromechanical layer structure as recited in claim 14, comprising:
   a first protective layer including silicon;
   a functional-layer layer structure situated on the first protective layer, the functional-layer layer structure including at least one functional layer, the at least one functional layer including a piezoelectric layer; and
   a second protective layer situated on the functional-layer layer structure, the second protective layer including silicon, at least one opening being positioned, which extends in a vertical direction through the functional-layer layer structure, the first protective layer, and the second protective layer, to release a part of the micromechanical layer structure,
   wherein an electrode layer, which at least partially contains a metal and/or a metallic compound, is situated above the at least one functional layer in the functional-layer layer structure,
   wherein at least one of:

the width of the opening in the electrode layer is greater than or equal to the width of the opening in the material of the at least one functional layer; or an intermediate protective layer is situated between the at least one functional layer and the electrode layer, and the opening has a greater width in a region of the intermediate protective layer than in at least one of the at least one functional layer.

16. A micromechanical layer structure, comprising:

a first protective layer including silicon;

a functional-layer layer structure situated on the first protective layer, the functional-layer layer structure including at least one functional layer, the at least one functional layer including a piezoelectric layer; and a second protective layer situated on the functional-layer layer structure, the second protective layer including silicon, at least one opening being positioned, which extends in a vertical direction through the functional-layer layer structure, the first protective layer, and the second protective layer, to release a part of the micromechanical layer structure, wherein at least one of:

at least one of the first and second protective layers is situated partially in an opening in at least one of the at least one layer of the functional-layer layer structure; or at least one of the first and second protective layers is situated only in a lower region of the opening in the at least one functional layer of the functional-layer layer structure.

* * * * *